(12) United States Patent
Noma

(10) Patent No.: US 7,576,402 B2
(45) Date of Patent: Aug. 18, 2009

(54) SEMICONDUCTOR DEVICE, METHOD OF MANUFACTURING THE SAME, AND CAMERA MODULE

(75) Inventor: Takashi Noma, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 241 days.

(21) Appl. No.: 11/642,958

(22) Filed: Dec. 21, 2006

(65) Prior Publication Data

US 2007/0166955 A1 Jul. 19, 2007

(30) Foreign Application Priority Data

Dec. 21, 2005 (JP) .............................. 2005-368631

(51) Int. Cl.
*H01L 31/0232* (2006.01)
*H01L 31/0203* (2006.01)
*H01L 29/267* (2006.01)

(52) U.S. Cl. ...................... 257/432; 257/434; 257/433; 257/81

(58) Field of Classification Search ................. 257/432, 257/433, 434, 81
See application file for complete search history.

(56) References Cited

U.S. PATENT DOCUMENTS

| | | | | |
|---|---|---|---|---|
| 6,342,406 | B1 * | 1/2002 | Glenn et al. | 438/57 |
| 6,503,780 | B1 * | 1/2003 | Glenn et al. | 438/116 |
| 7,115,961 | B2 * | 10/2006 | Watkins et al. | 257/433 |
| 7,250,664 | B2 * | 7/2007 | Shirakawa et al. | 257/443 |
| 2004/0070076 | A1 | 4/2004 | Hayashimoto et al. | |
| 2005/0275746 | A1 | 12/2005 | Nishida et al. | |
| 2006/0252246 | A1 | 11/2006 | Paik et al. | |

FOREIGN PATENT DOCUMENTS

| | | |
|---|---|---|
| EP | 1 432 239 A1 | 6/2004 |
| JP | 2005-065285 A | 3/2005 |
| KR | 2004-33193 | 4/2004 |
| KR | 2005-87737 | 8/2005 |
| KR | 2005-119101 | 12/2005 |
| WO | WO 99/40624 | 8/1999 |
| WO | WO-2005/031422 A1 | 4/2005 |

OTHER PUBLICATIONS

European Search Report mailed May 29, 2008 directed to counterpart EP Application No. 06026547.7 (6 pages).

* cited by examiner

*Primary Examiner*—Luan C Thai
(74) *Attorney, Agent, or Firm*—Morrison & Foerster LLP

(57) ABSTRACT

The invention provides a package type semiconductor device and a method of manufacturing the same where reliability and yield are enhanced without making a manufacturing process complex. A resin layer and a supporting body are formed on a front surface of a semiconductor substrate formed with a pad electrode. Then, the resin layer and the supporting body are removed by etching so as to expose the pad electrode. By this etching, the supporting body in two conductive terminal formation regions facing each other over a dicing line and the supporting body in a region connecting with these regions therebetween are simultaneously removed to form an opening, as shown in FIG. 3C. Then, a metal layer is formed on the pad electrode exposed in the opening, and a conductive terminal is further formed thereon. Lastly, dicing is performed along the dicing line to separate the semiconductor substrate in individual semiconductor dies.

4 Claims, 16 Drawing Sheets

US 7,576,402 B2

SEMICONDUCTOR DEVICE, METHOD OF MANUFACTURING THE SAME, AND CAMERA MODULE

CROSS-REFERENCE OF THE INVENTION

This application claims priority from Japanese Patent Application No. 2005-368631, the content of which is incorporated herein by reference in its entirety.

BACKGROUND OF THE INVENTION

1. Field of the Invention

The invention relates to a semiconductor device, particularly, a package type semiconductor device and a method of manufacturing the same. The invention also relates to a camera module having a package type semiconductor device.

2. Description of the Related Art

A CSP (chip size package) has received attention in recent years as a new packaging technology. The CSP is a small package having about the same outside dimensions as those of a semiconductor die packaged in it.

A BGA (ball grid array) type semiconductor device has been known as a type of the CSP. In the BGA type semiconductor device, a plurality of ball-shaped conductive terminals made of metal such as solder is arrayed on one surface of a package and is electrically connected to a semiconductor die mounted on the other surface of the package.

When the BGA type semiconductor device is mounted on electronic equipment, the semiconductor die is electrically connected to an external circuit on a printed board by bonding the conductive terminals to wiring patterns on the printed board.

Such a BGA type semiconductor device has advantages in providing a large number of conductive terminals and in reducing a size over the other CSP type semiconductor devices such as an SOP (small outline package) and a QFP (quad flat Package), which have lead pins protruding from their sides. Therefore, the BGA type semiconductor device has a wide field of application, for example, as an image sensor chip of a digital camera mounted on a cellular phone or the like.

FIGS. 15A and 15B show an outline structure of the conventional BGA type semiconductor device. FIG. 15A is an oblique perspective view showing the front side of the BGA type semiconductor device. FIG. 15B is an oblique perspective view showing the back side of the BGA type semiconductor device.

A semiconductor substrate 104 is sealed between a first glass substrate 102 and a second glass substrate 103 with resin layers 105a and 105b of epoxy resin or the like interposed therebetween in the BGA type semiconductor device 101. A plurality of conductive terminals 106 is arrayed in a grid pattern on a surface of the second glass substrate 103, that is, on a back surface of the BGA type semiconductor device 101. The conductive terminals 106 are connected to the semiconductor substrate 104 through second wirings 109. The plurality of second wirings 109 is connected with aluminum wirings extending from inside the semiconductor substrate 104, making each of the conductive terminals 106 electrically connected with the semiconductor die 104.

More detailed explanation on a cross-sectional structure of the BGA type semiconductor device 101 will be given hereafter referring to FIG. 16. FIG. 16 shows a cross-sectional view of the BGA type semiconductor devices 101 separated in individual dies along a dicing line.

A first wiring 107 is provided on an insulation film 108 formed on a front surface of the semiconductor substrate 104. The front surface of the semiconductor substrate 104 is attached on the first glass substrate 102 with the resin layer 105a. A back surface of the semiconductor die 104 is attached on the second glass substrate 103 with the resin layer 105b made of epoxy resin or the like.

One end of the first wiring 107 is connected to the second wiring 109. The second wiring 109 extends from the end of the first wiring 107 onto the surface of the second glass substrate 103. The ball-shaped conductive terminal 106 is formed on the second wiring 109 extended onto the second glass substrate 103. A protection film 110 made of a solder resist or the like is further formed on the surface of the second wiring 109. Relevant technologies are disclosed in Japanese Patent Application Publication No. 2002-512436.

However, there is a problem that a process of manufacturing the described conventional semiconductor device 101 is complex. Furthermore, the reliability of the described semiconductor device 101 is not enough because of its complex structure. For example, there is a possibility that the first wiring 107 and the second wiring 109 of the BGA type semiconductor device 101 are disconnected at a point of contact between them since the area of the point of contact is very small. There is also a problem of insufficient step coverage of the second wiring 109.

SUMMARY OF THE INVENTION

Features of the invention are as follows. That is, the invention provides a method of manufacturing a semiconductor device including: attaching a supporting body on a front surface of a semiconductor substrate having a pad electrode and partitioned by a dicing line; forming an opening exposing a portion of the semiconductor substrate by selectively removing the supporting body in external connection electrode formation regions facing each other over the dicing line and in a region connecting with the external connection electrode formation regions therebetween; and separating the semiconductor substrate in individual semiconductor dies by dicing along the dicing line.

In the method of the invention, an electronic device is formed on the front surface of the semiconductor substrate, and the supporting body in a region not overlapping the electronic device is thinned by etching before forming the opening.

The invention also provides a semiconductor device including: a semiconductor substrate having an electronic device and an external connection electrode electrically connected to the electronic device; and a supporting body attached on the semiconductor substrate over the electronic device; wherein an opening is provided on a periphery of the supporting body in a direction from outside to inside, and the external connection electrode is formed in the opening.

In the semiconductor device of the invention, the supporting body in a region overlapping the electronic device is thicker than a portion of the supporting body in a region not overlapping the electronic device.

The invention also provides a camera module including: an image pickup device; a circuit board having an external electrode and mounted with the image pickup device; and a lens leading light to a light receiving region of the image pickup device, the image pickup device including: a semiconductor substrate having a light receiving element and an external connection electrode electrically connected to the light receiving element; and a supporting body attached on the semiconductor substrate over the light receiving element and having an opening penetrating the body from its front surface to its back surface; wherein the external electrode of the circuit board and the external connection electrode are electrically connected through the opening.

In the camera module of the invention, the opening is formed on a periphery of the supporting body in a direction from outside to inside.

In the camera module of the invention, the supporting body in a region overlapping the light receiving element is thicker than a portion of the supporting body in a region not overlapping the light receiving element.

DETAILED DESCRIPTION OF THE INVENTION

Figure 1A:
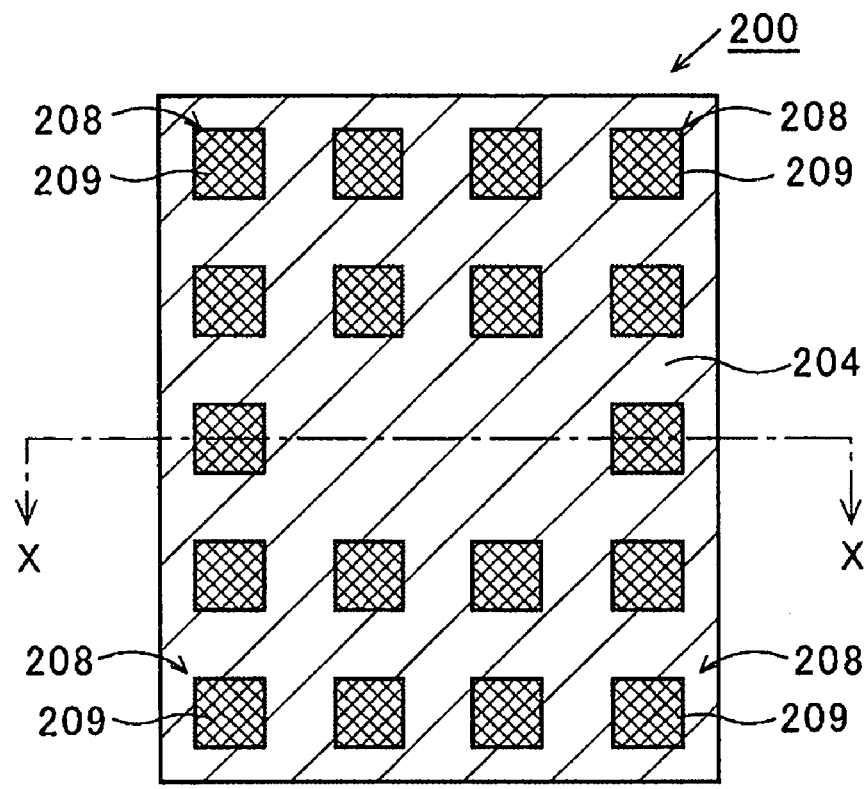
FIGS. 1A and 1B are respectively a plan view and a cross-sectional view for explaining a semiconductor device and its manufacturing method of a first embodiment the invention.
Figure 1B:
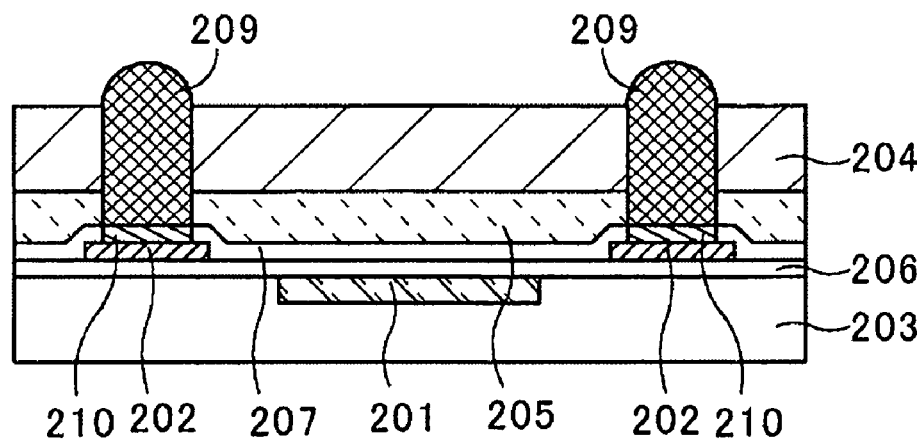

A first embodiment of this invention is directed to solving the problems identified above and shown in FIGS. 1A and 1B. FIG. 1A is a plan view of the upper side of a semiconductor device 200, and FIG. 1B is a cross-sectional view of FIG. 1A along line X-X.

In the semiconductor device 200, a supporting body 204 made of glass is attached on a semiconductor substrate 203 formed with electronic devices 201 and pad electrodes 202 on its front surface with a resin layer 205 interposed therebetween. A numeral 206 designates an insulation film made of a BPSG or silicon oxide film, and a numeral 207 designates a passivation film made of a silicon nitride film or the like and covering a portion of the pad electrode 202.

Openings 208 are formed in a predetermined region of the supporting body 204, penetrating the body 204 from its front surface to its back surface, and a plurality of conductive terminals 209 made of solder or the like is formed in the openings, 208 respectively. The conductive terminals 209 are electrically connected with the pad electrodes 202 with a metal layer 210 made of nickel or gold interposed therebetween.

In this structure, since the conductive terminals 209 are directly formed in the plurality of openings 208 provided in the supporting body 204 respectively, there is no need to provide the wirings as shown in the conventional art, providing an advantage that the manufacturing process is simplified. Furthermore, since the front surface of the semiconductor substrate 203 is protected by the supporting body 204, the electronic devices 201 or the surrounding elements on the front surface are prevented from deteriorating, thereby enhancing the reliability and yield of the semiconductor device.

However, since each of the openings 208 in this semiconductor device 200 is micro-sized (e.g. forms an almost square shape of about 100×100 μm), there is a problem of difficulty in formation of the openings 208 with desired size in target positions of the supporting body 204 with high accuracy.

Thus, a second embodiment of the invention is directed to simplification of a process of manufacturing a semiconductor device and enhancement of the reliability and yield of the semiconductor device. The invention is also directed to reduction of the size of a camera module set with a semiconductor device as an image pickup device and enhancement of its reliability and yield.

Figure 2A:
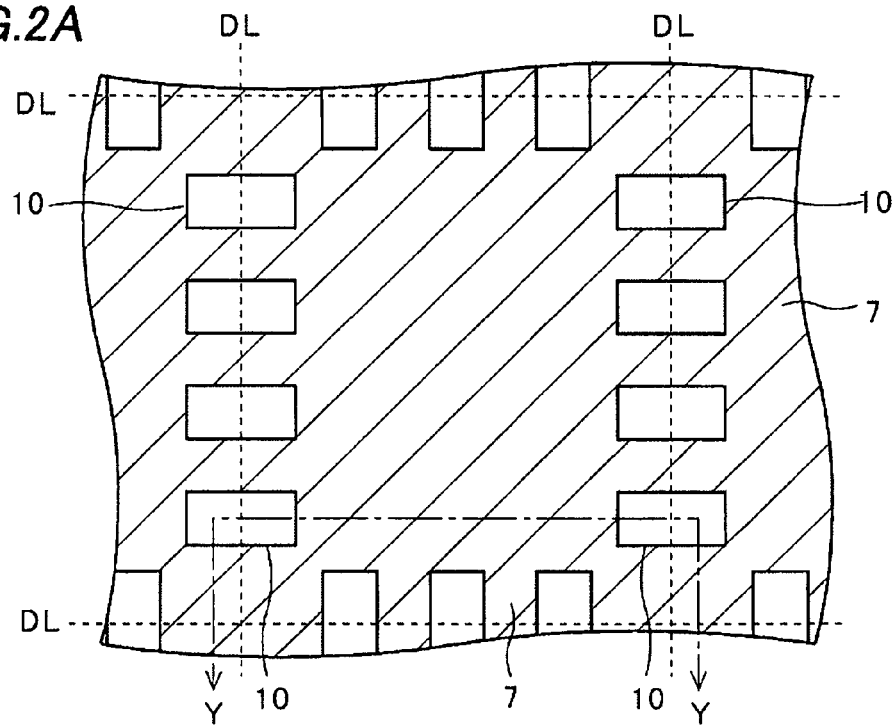
FIGS. 2A and 2B is a plan view for explaining a semiconductor device and its manufacturing method of a second embodiment of the invention.
Figure 2B:
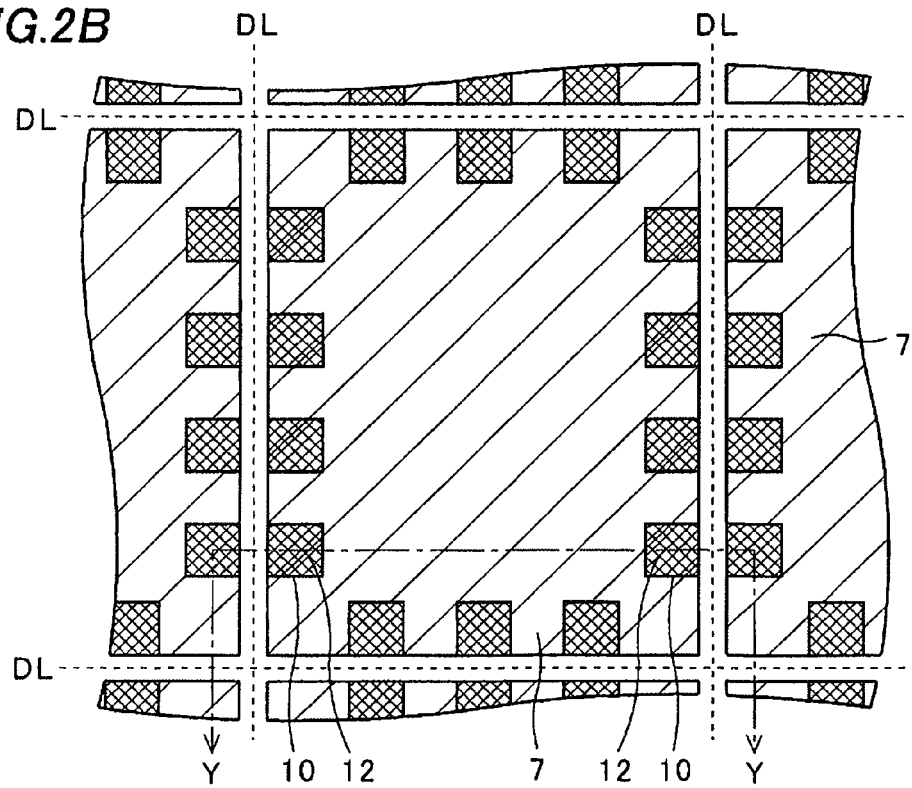

A semiconductor device and a method of manufacturing the semiconductor device of the second embodiment of the invention will be described referring to figures. FIG. 2B is a schematic plan view of the upper side of the semiconductor device of the embodiment. FIGS. 3A to 5 are cross-sectional views of FIG. 2 along line Y-Y, being shown in manufacturing order.

One of features of the semiconductor device of the second embodiment of the invention is that a plurality of openings 10 is provided along a periphery of a supporting body 7 in a direction from outside to inside as shown in FIG. 2B, and a conductive terminal 12 and a metal layer 11 that are to be electrically connected to the other circuit board are formed in each of the openings 10. Hereafter, the method of manufacturing the semiconductor device will be described in detail.

Figure 3A:
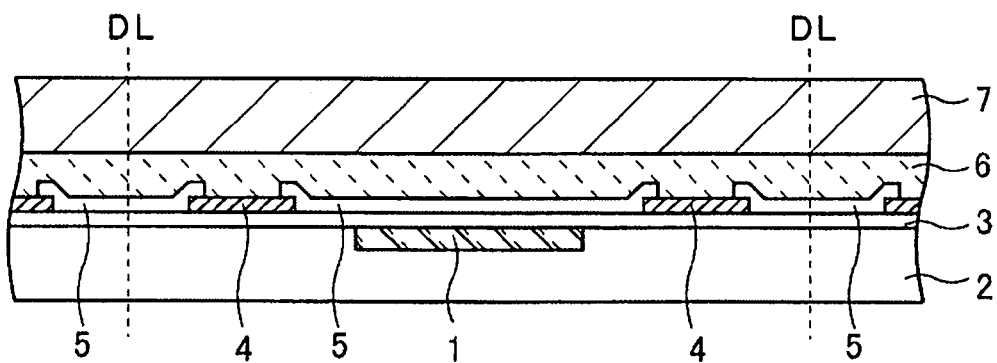
FIGS. 3A to 5 are cross-sectional views for explaining the semiconductor device and its manufacturing method of the second embodiment of the invention.

First, as shown in FIG. 3A, a semiconductor substrate 2 made of silicon (Si) or the like that is formed with an electronic device 1 on its front surface is prepared. Then, a first insulation film 3 (e.g. a silicon oxide film or a BPSG film formed by a thermal oxidation method, a CVD method, or the like) is formed on a front surface of the semiconductor substrate 2 to have a thickness of, for example, 2 μm.

Then, a metal layer made of aluminum (Al), copper (Cu) or the like is formed by a sputtering method, a plating method, or the other deposition method, and then the metal layer is etched using a photoresist layer (not shown) as a mask to form a pad electrode 4 having a thickness of, for example, 1 μm on the first insulation film 3. The pad electrode 4 is electrically connected with the electronic device 1 or the surrounding elements.

Then, a passivation film 5 (e.g. a silicon nitride film formed by a CVD method) is formed on the front surface of the semiconductor substrate 2, covering a portion of the pad electrode 4.

Then, a supporting body 7 is attached on the front surface of the semiconductor substrate 2 including on the pad electrode 4 with a resin layer 6 made of epoxy resin or the like interposed therebetween. The supporting body 7 is made of, for example, glass, quartz, plastic, or the like, and has a function of supporting the semiconductor substrate 2 and protecting the front surface thereof. When the electronic device 1 is a light receiving element such as CCD, the supporting body 7 is made of a transparent or semitransparent material and has light transmission characteristics. Then, according to needs, back-grinding is performed to a back surface of the semiconductor substrate 2 to thin the semiconductor substrate 2.

Figure 3B:
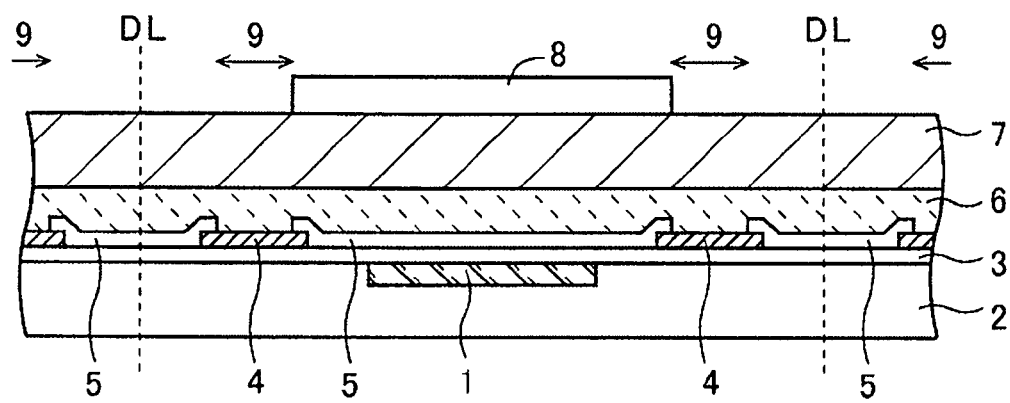

Next, as shown in FIG. 3B, a photoresist layer 8 is selectively formed on a surface of the supporting body 7. The photoresist layer 8 is formed so as to have an opening in two conductive terminal formation regions 9 adjacent to each other over a dicing line DL and in a region between these regions 9.

Figure 3C:
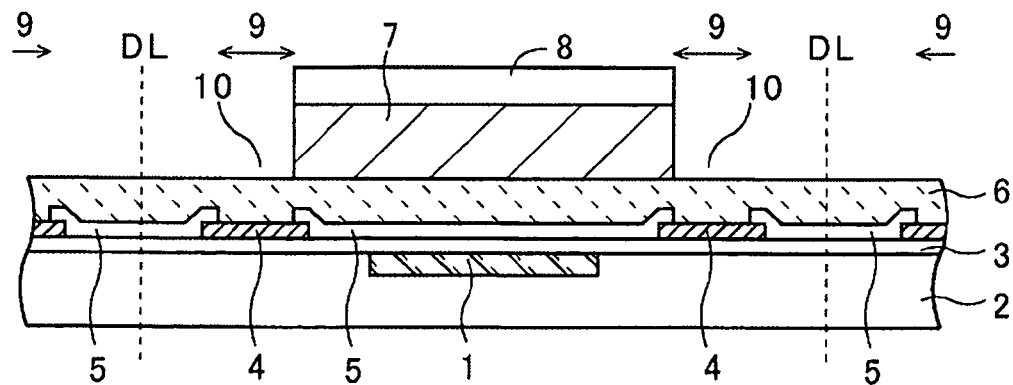

Next, as shown in FIG. 3C, the supporting body 7 is selectively etched using the photoresist layer 8 as a mask. By this etching, the supporting body 7 in the two conductive terminal formation regions 9 facing over the dicing line DL and the supporting body 7 in the region connecting with these regions 9 therebetween are removed as a unit, thereby forming an opening 10 penetrating the supporting body 7. The openings 10 are formed along the periphery of the supporting body 7 at equal intervals as shown in FIG. 2A, when seen from the upper side.

This selective etching is, for example, dry-etching, or dip etching with hydrofluoride (HF) as an etching solution. Compared with a semiconductor device 200 (see FIG. 1A) where an etching unit is each conductive terminal formation region, an etching unit of the supporting body covers two conductive terminal formation regions and covers the twice larger area, so that the opening is easily formed in a desired position with high accuracy.

Figure 4A:
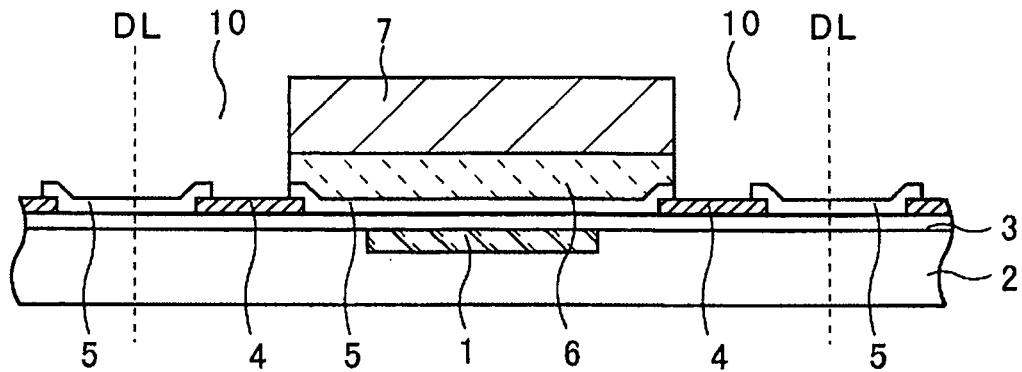

Next, as shown in FIG. 4A, the resin layer 6 exposed at a bottom of the opening 10 is selectively etched to expose a portion of the pad electrode 4. It is noted that the supporting body 7 and the resin layer 6 may be etched at a time.

Figure 4B:
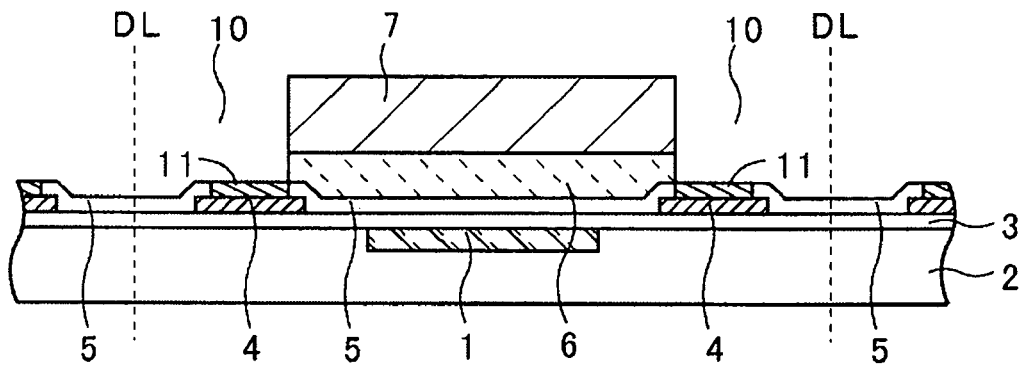

Next, as shown in FIG. 4B, a metal layer 11 made of nickel (Ni) and gold (Au) or the like is formed on the pad electrode 4 exposed at the bottom of the opening 10.

Figure 4C:
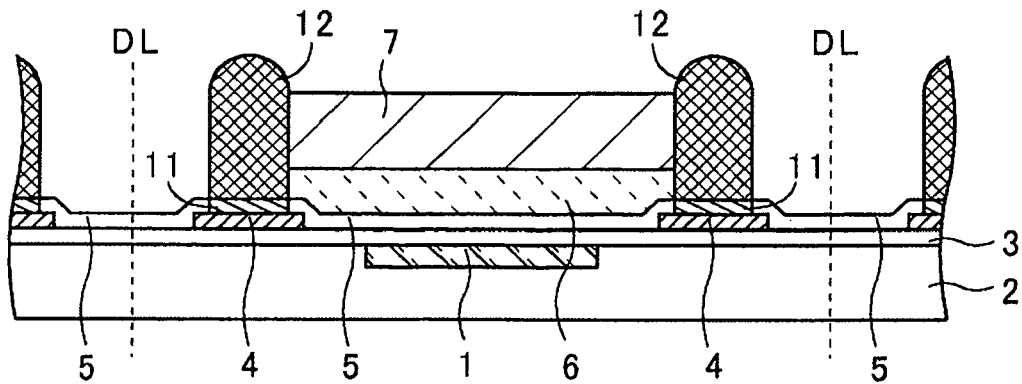

Next, as shown in FIG. 4C, a solder ball is bonded to a predetermined region of the metal layer 11 by an electrolytic plating method using the metal layer 11 as a plating electrode, thereby forming a conductive terminal 12. This conductive terminal 12 may be also formed by screen-printing solder and reflowing the solder by heat treatment. The method of forming the conductive terminal 12 is not limited to these, and may be also formed by a so-called dispensing (coating) method in which solder or the like is coated with a dispenser. The conductive terminal 12 may be made of gold, and its material is not particularly limited. Furthermore, there is also a case of not forming the conductive terminal 12 as described below. In this case, the metal layer 11 or the pad electrode 4 is exposed.

Figure 5:
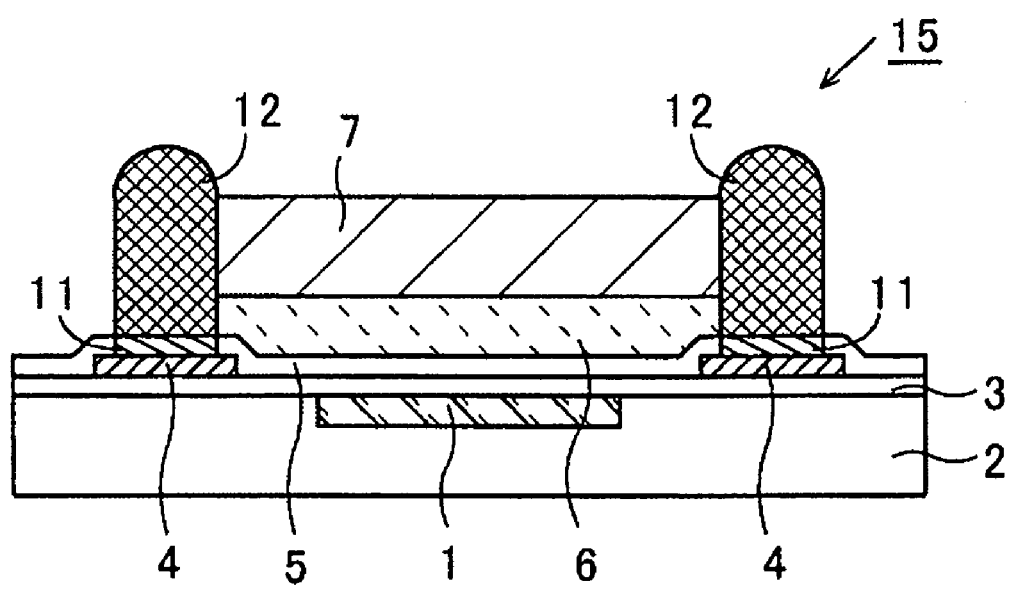

Lastly, as shown in FIG. 5, the semiconductor substrate 2 is separated in individual semiconductor dies 15 along the dicing line DL. FIG. 2B is a schematic plan view after the dicing. The semiconductor device of this embodiment is thus completed. The completed semiconductor device is mounted on a circuit board formed with an external electrode by patterning or the like. In this mounting process, the conductive terminal 12 is electrically connected to the external electrode on the circuit board, serving as an external connection electrode. In the case of not forming the conductive terminal 12, the metal layer 11 or the pad electrode 4 is electrically connected to the external electrode on the circuit board through a bonding wire or the like, serving as the external connection electrode.

The second embodiment has an advantage that a complex wiring such as conventionally needed is not necessary and the manufacturing process is simplified. Furthermore, since the front surface of the semiconductor substrate 2 is protected by the supporting body 7, the electronic device 1 or the surrounding elements formed on the front surface are prevented from deteriorating, thereby enhancing the reliability of the semiconductor device. Furthermore, since the opening 10 is easily formed in the supporting body 7 as described above, the manufacturing cost is minimized, resulting in enhancement of the reliability and yield of the semiconductor device.

Figure 6A:
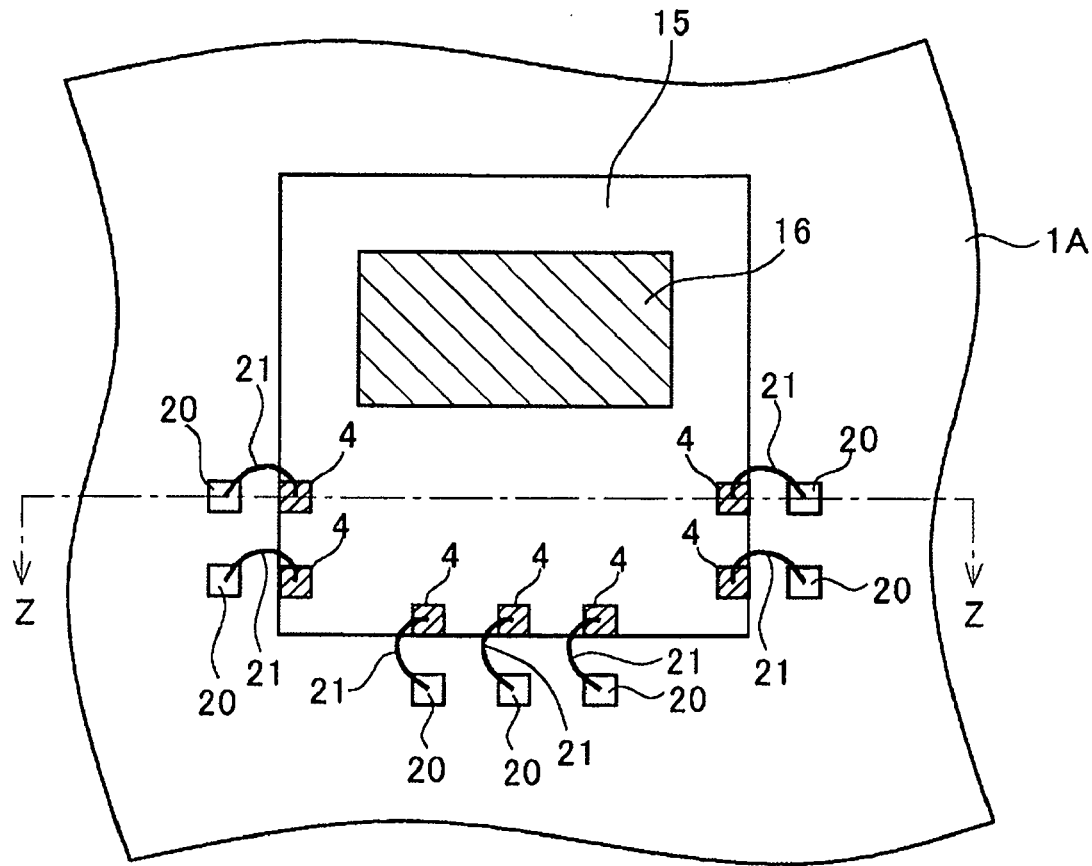
FIGS. 6A and 6B are respectively a plan view and a cross-sectional view for explaining a state where the semiconductor device of the second embodiment of the invention is mounted.

Next, descriptions will be given on a case where the semiconductor device of the second embodiment is mounted on the circuit board (a module substrate) referring to figures. In the following description, the electronic device 1 is used as a light receiving element such as a CCD image sensor or a CMOS image sensor, and the semiconductor die 15 is used as an image pickup device of a camera module. FIG. 6A is a plan view of the upper side of a camera module mounted with the semiconductor device of this embodiment, and FIG. 6B is a cross-sectional view of FIG. 6A along line Z-Z.

As shown in FIG. 6A, the semiconductor die 15 is mounted on a circuit board 1A such as, for example, a printed board. The semiconductor die 15 is so formed that its back surface side (the side not formed with the supporting body 7) faces the circuit board 1A. External electrodes 20 are formed on the circuit board 1A by patterning.

Then, the pad electrodes 4 of the semiconductor die 15 and the external electrodes 20 are electrically connected through, for example, bonding wires 21. A flexible sheet or tape formed with a conductive pattern may be used instead of the bonding wire 21. Although not shown in the figures, the metal layer 11 may be formed on the pad electrode 4 and this metal layer 11 and the external electrode 20 may be electrically connected through the bonding wire 21 or the like.

Figure 6B:
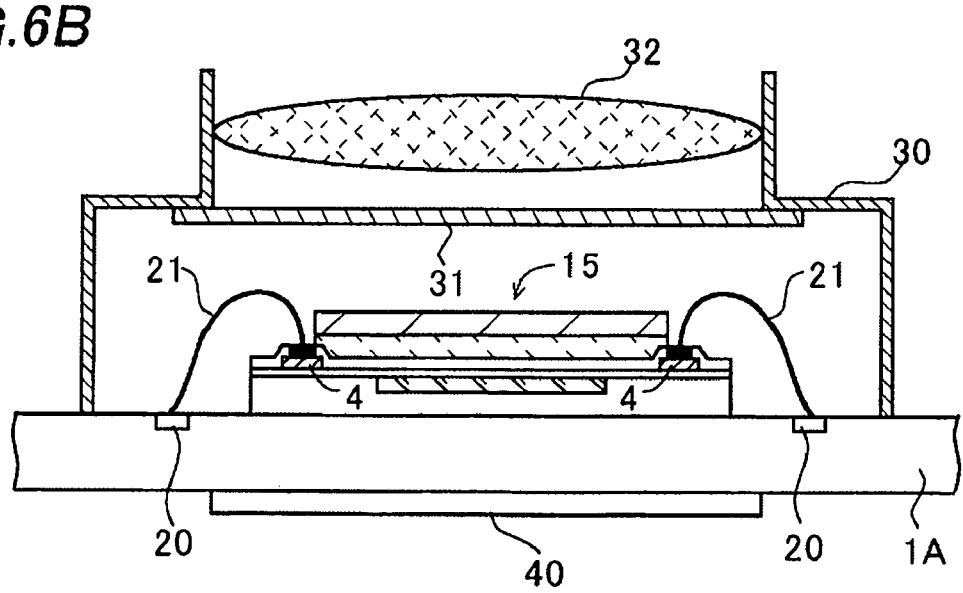
Figure 15A:
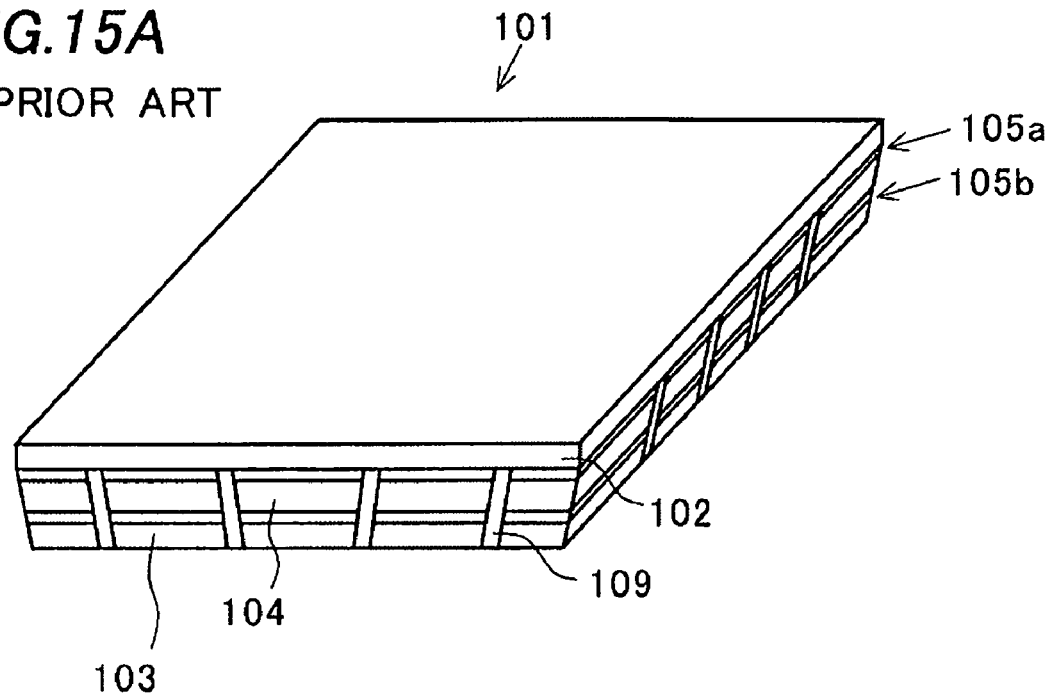
FIGS. 15A and 15B are perspective views for explaining a conventional semiconductor device.
Figure 15B:
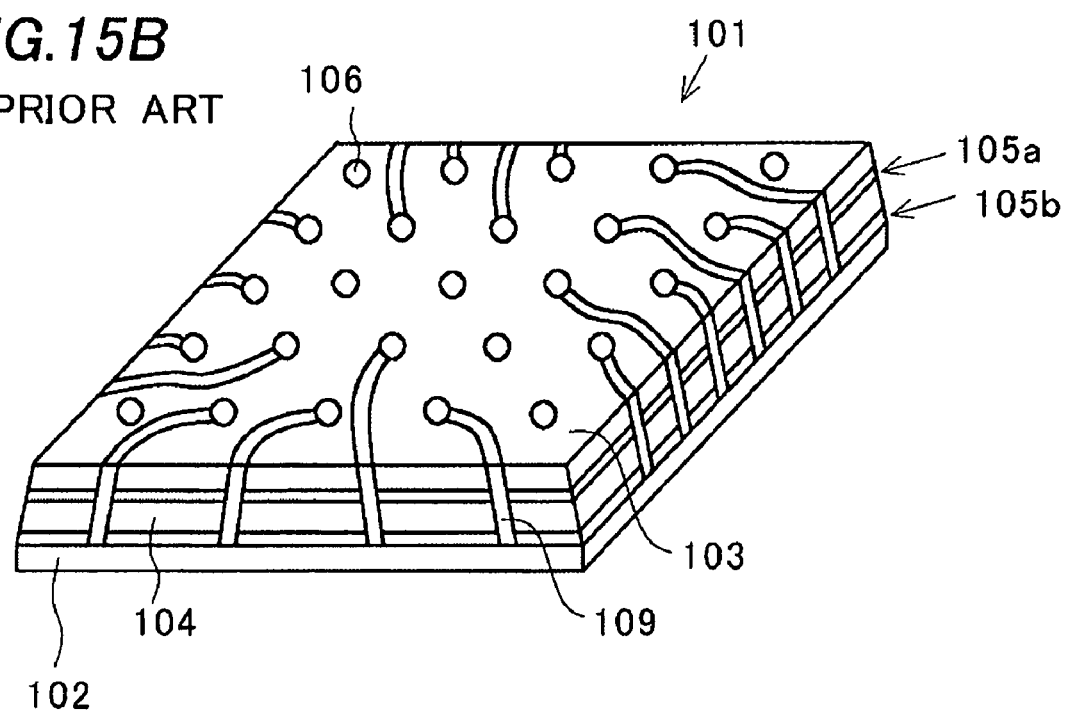
Figure 16:
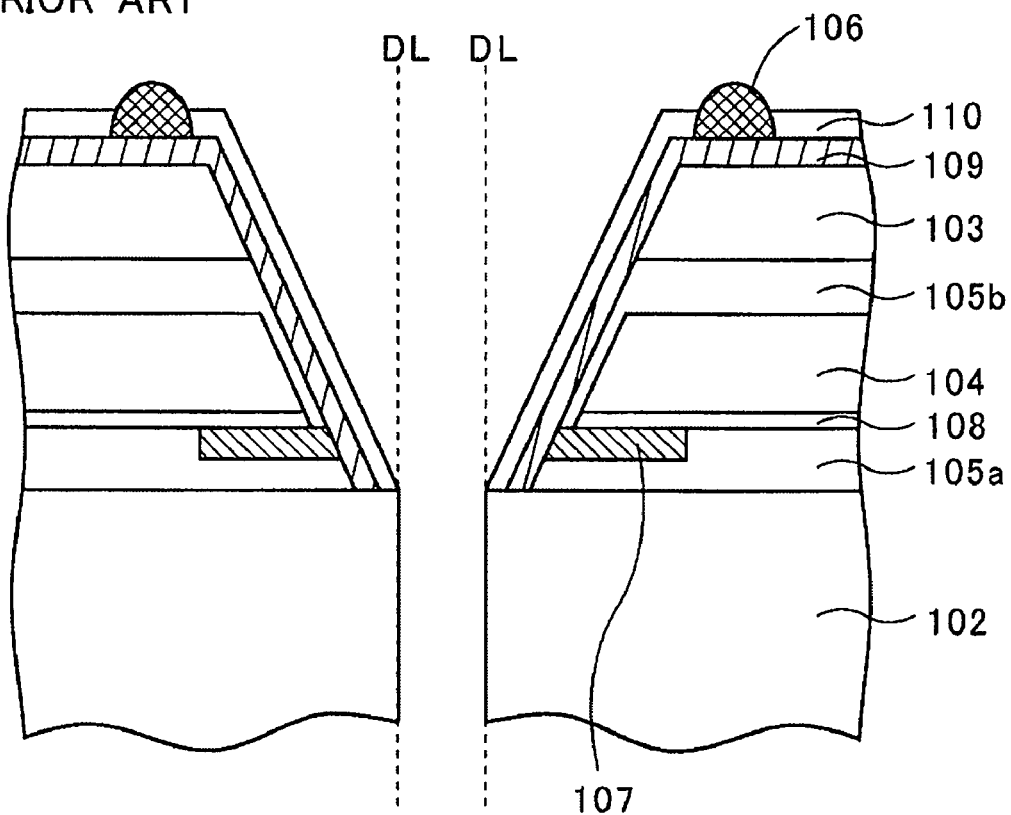
FIG. 16 is a cross-sectional view for explaining the conventional semiconductor device.

Furthermore, as shown in FIG. 6B, a lens barrel 30 is provided on a front surface of the circuit board 1A, covering the semiconductor die 15. A filter 31 cutting light of a predetermined wavelength and a lens 32 focusing external light are provided in the lens barrel 30 in a position corresponding to the light receiving region 16 of the semiconductor die 15. Differing from a conventional semiconductor device 101 (see FIG. 15), the back surface of the semiconductor die 15 is not formed with a conductive terminal and is planarized, thereby minimizing slanting or shifting of the semiconductor die 15 when this is mounted. Furthermore, this prevents undesirable influence on an image when taken by the camera module.

A DSP (digital signal processor) chip 40 processing an image signal sent from the light receiving element may be disposed on a back surface of the circuit board 1A. By superposingly forming the semiconductor die 15 and the DSP chip 40 on the front surface and the back surface of the circuit board 1A respectively, the area of the circuit board 1A is reduced.

Figure 7A:
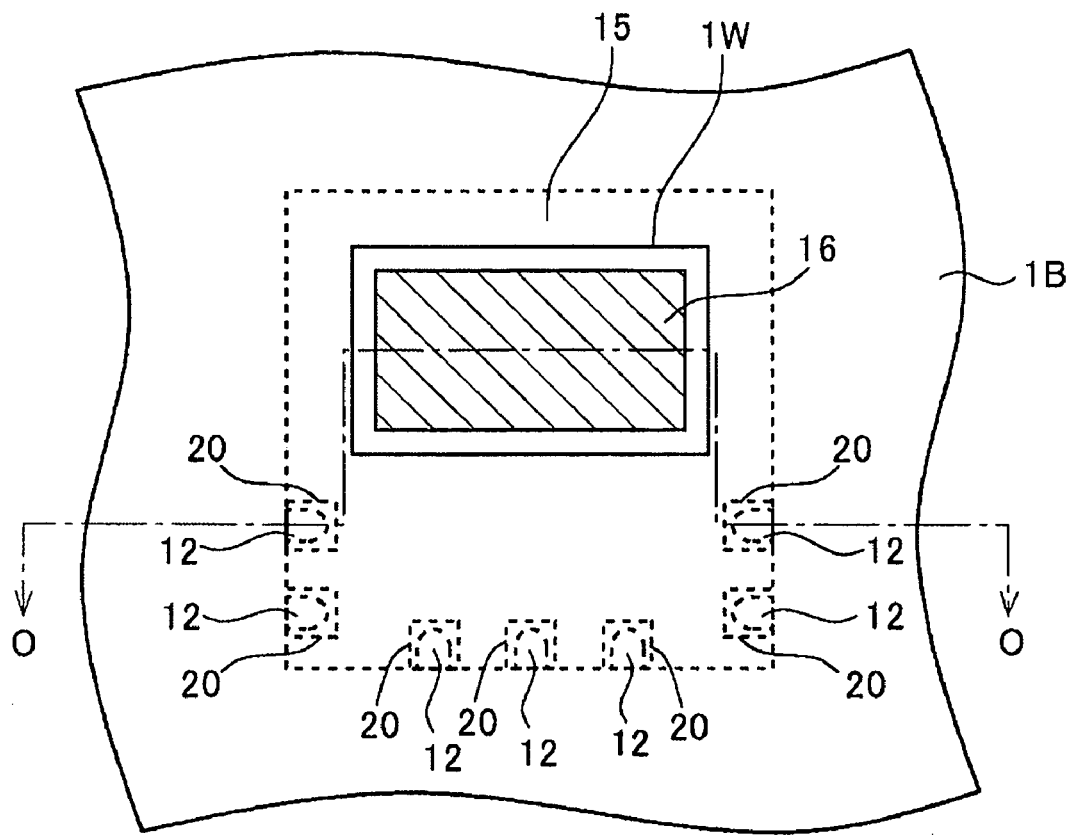
FIGS. 7A and 7B are respectively a plan view and a cross-sectional view for explaining a state where the semiconductor device of the second embodiment of the invention is mounted.
Figure 7B:
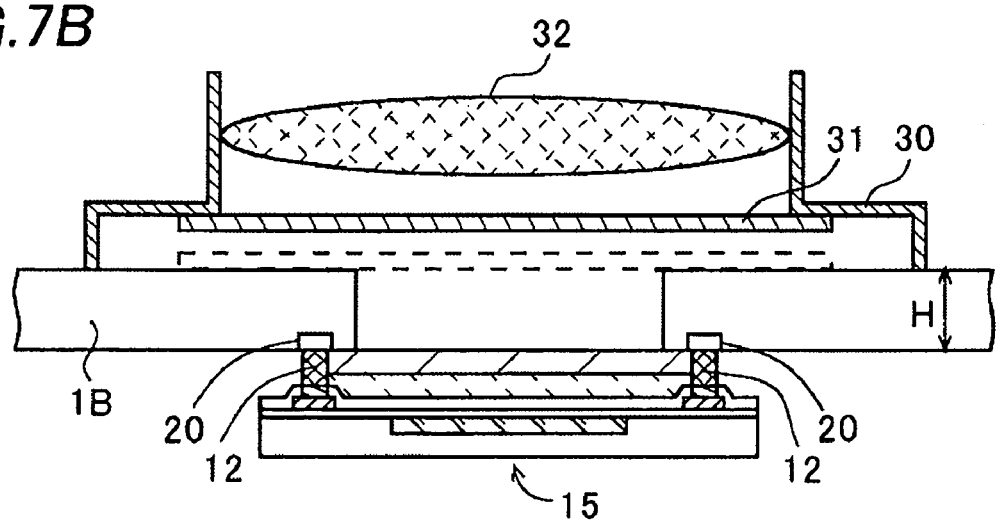

Alternatively, the semiconductor device of the embodiment may be mounted on the circuit board in a manner shown in FIGS. 7A and 7B. FIG. 7A is a plan view of the upper side of the semiconductor device of this embodiment, which is mounted as an image pickup device of a camera module, and FIG. 7B is a cross-sectional view of FIG. 7A along line 0-0. The same numerals are given to the same components as those shown in FIGS. 6A and 6B and description thereof will be omitted.

As shown in FIG. 7A, the semiconductor die 15 is so mounted that its front surface faces a back surface of a circuit board 1B such as, for example, a printed board. The conductive terminals 12 are directly connected to the external electrodes 20 formed on the back surface of the circuit board 1B by patterning.

An opening is formed in the circuit board 1B in a region overlapping the light receiving region 16 to provide a light receiving window 1W. Therefore, the semiconductor die 15 receives light even when it is mounted on the back surface of the circuit board 1B.

Furthermore, since the semiconductor die 15 is mounted on the back surface of the circuit board 1B in this structure, the thickness of the circuit board 1B forms a part of the focal length. Therefore, compared with the structure where the semiconductor die 15 is disposed above the circuit board as shown in FIGS. 6A and 6B, the reduction of the height of the lens barrel 30 is achieved at least by an amount of a thickness H of the circuit board 1B, so that the size of the camera module is reduced.

By the way, when dusts and foreign substances are attached to a light receiving surface of the image pickup device in the camera module, its quality may be degraded by reduction of a light receiving amount or a blur occurring in an image. Therefore, the filter 31 may be fixed on the circuit board 1B as shown by a dotted line in FIG. 7B using a special jig. By using the filter 31 not only as a filter that is its original role (cutting light of a predetermined wavelength) but also as a lid sealing the front surface of the semiconductor die 15, dusts and foreign substances are effectively prevented from being attached to the light receiving surface (the front surface of the supporting body 7) and thus the reliability of the camera module is enhanced.

Figure 8A:
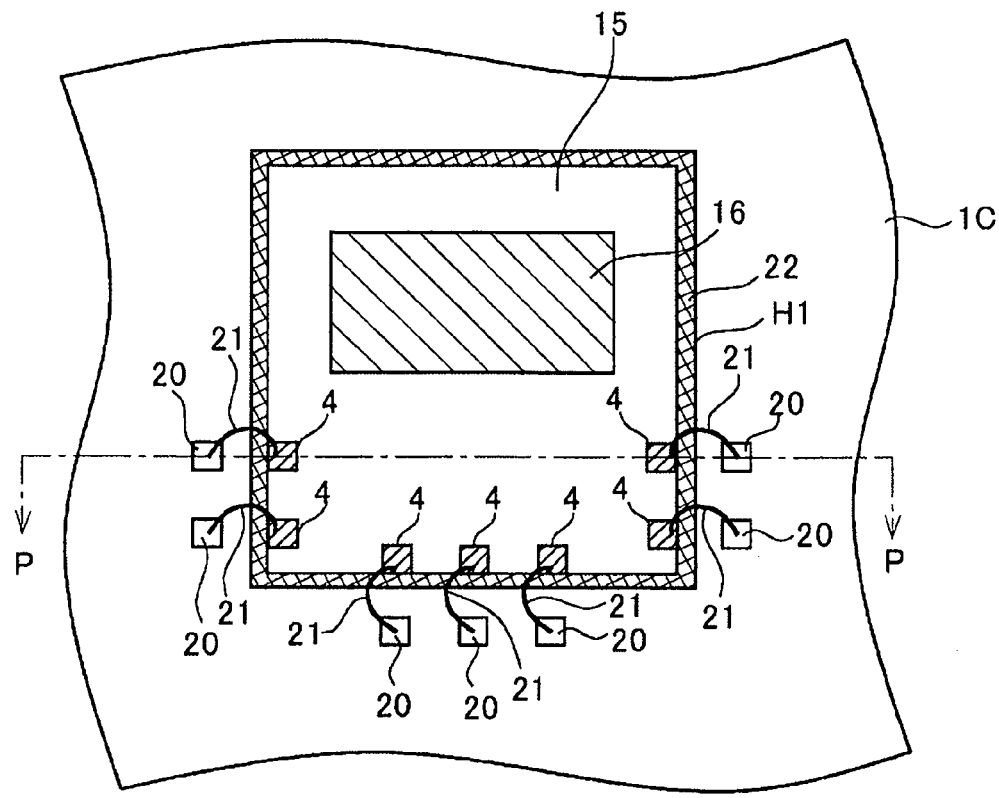
FIGS. 8A and 8B are respectively a plan view and a cross-sectional view for explaining a state where the semiconductor device of the second embodiment of the invention is mounted.
Figure 8B:
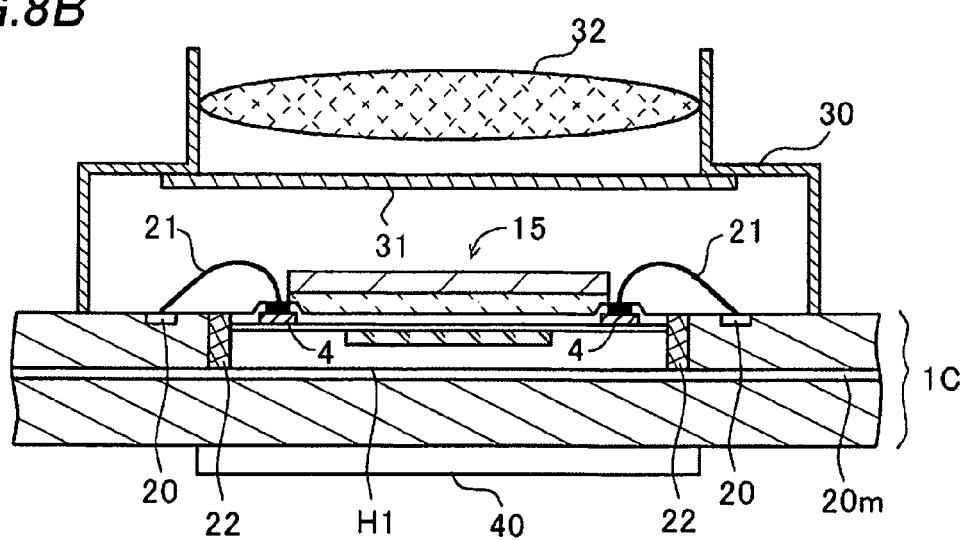

Alternatively, the semiconductor device of this embodiment may be mounted on the circuit board in a manner shown in FIGS. 8A and 8B. FIG. 8A is a plan view of the upper side of a camera module mounted with the semiconductor device of this embodiment, and FIG. 8B is a cross-sectional view of FIG. 8A along line P-P. The same numerals are given to the same components as those shown in FIGS. 6A, 6B, 7A, and 7B, and description thereof will be omitted.

As shown in FIG. 8B, a concave portion H1 is formed in a circuit board 1C such as, for example, a printed board, and the semiconductor die 15 is disposed, being embedded in the concave portion H1. The concave portion H1 is formed by etching with laser irradiation or cutting with a drill, for example.

A Cu layer 20m made of, for example, copper that has high heat conductivity is formed as a radiation layer on a bottom of the concave portion H1, contacting the back surface of the semiconductor die 15. This structure allows heat generated during the operation of the semiconductor die 15 to escape from a bottom of the semiconductor die 15 to the Cu layer 20m and to the outside.

This effectively prevents degradation of the performance of the electronic device 1 due to heat. Therefore, when the electronic device 1 is a light receiving element such as CCD that is easy to degrade in electric characteristics with heat, its performance is prevented from degrading and its operation quality is enhanced.

Although the front surface of the Cu layer 20m contacts the back surface of the semiconductor die 15 in FIG. 8B, these may not necessarily contact each other directly and an insulation film such as a silicon oxide film, a silicon nitride film, or a resin film may be formed therebetween.

When there is a space between a sidewall of the concave portion H1 and the semiconductor die 15 when the semiconductor die 15 is mounted, the space is filled with an underfill 22 (e.g. an organic material such as epoxy resin).

Figure 9:
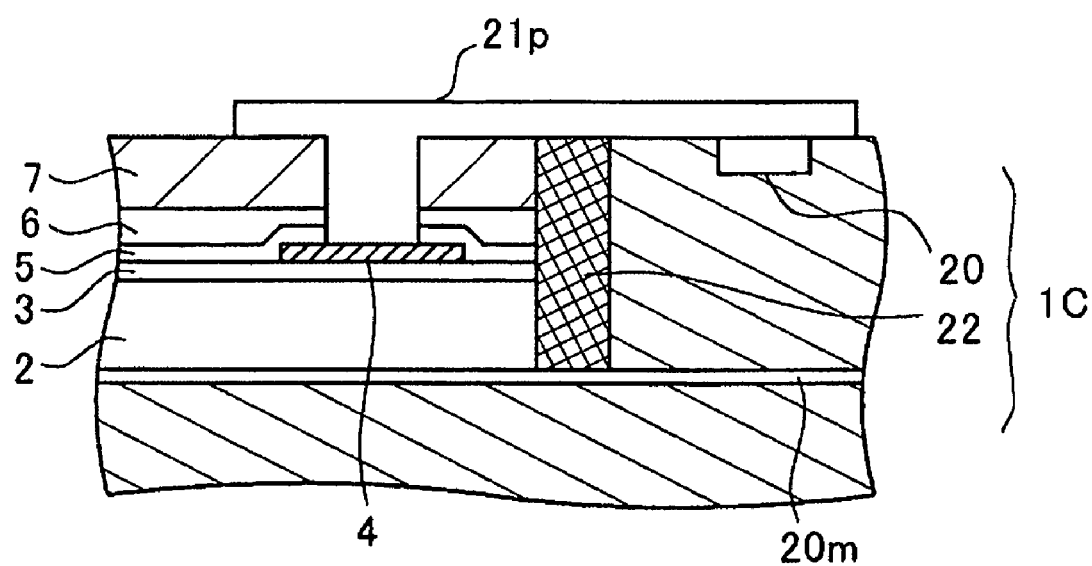
FIG. 9 is a cross-sectional view for explaining a state where the semiconductor device of the second embodiment of the invention is mounted.

Then, the pad electrodes 4 and the external electrodes 20 of the circuit board 1C are connected through the bonding wires 21. Although not shown in the figures, the metal layer 11 may be formed on the pad electrode 4, and the metal layer 11 and the external electrode 20 may be electrically connected through the bonding wire 21 or the like. Furthermore, a wiring made of, for example, a conductive paste 21p containing silver (Ag) particles may be used instead of the bonding wire 21 as shown in FIG. 9. The conductive paste 21p is formed from the opening on the pad electrode 4 onto the external electrode 20.

Figure 10A:
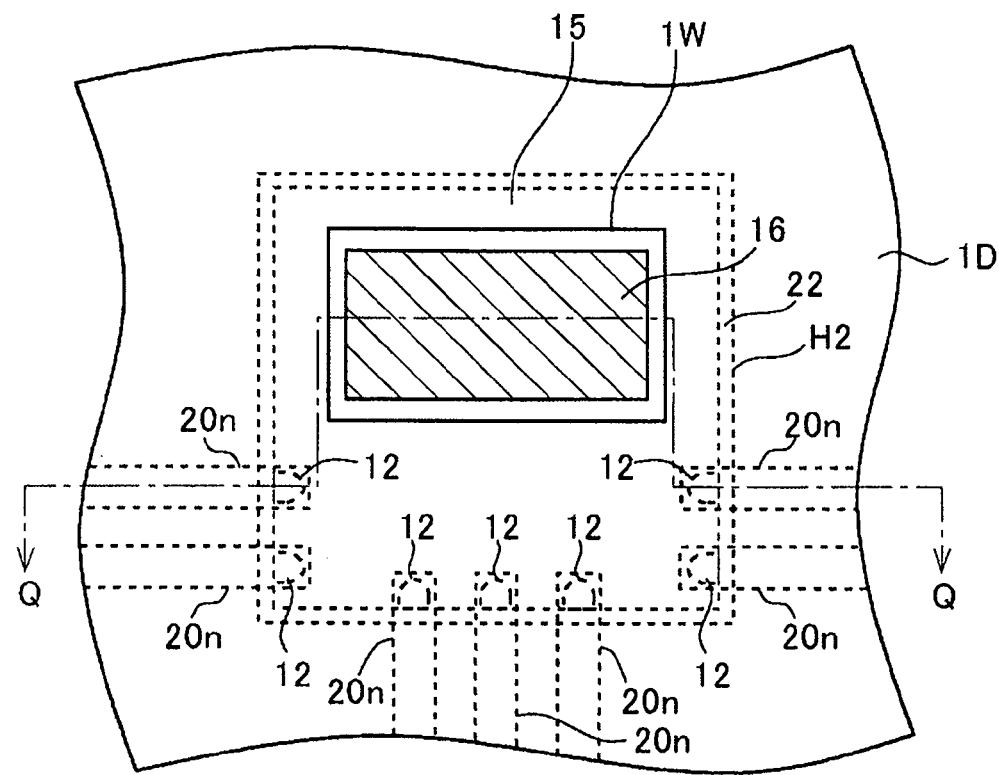
FIGS. 10A and 10B are respectively a plan view and a cross-sectional view for explaining a state where the semiconductor device of the second embodiment of the invention is mounted.
Figure 10B:
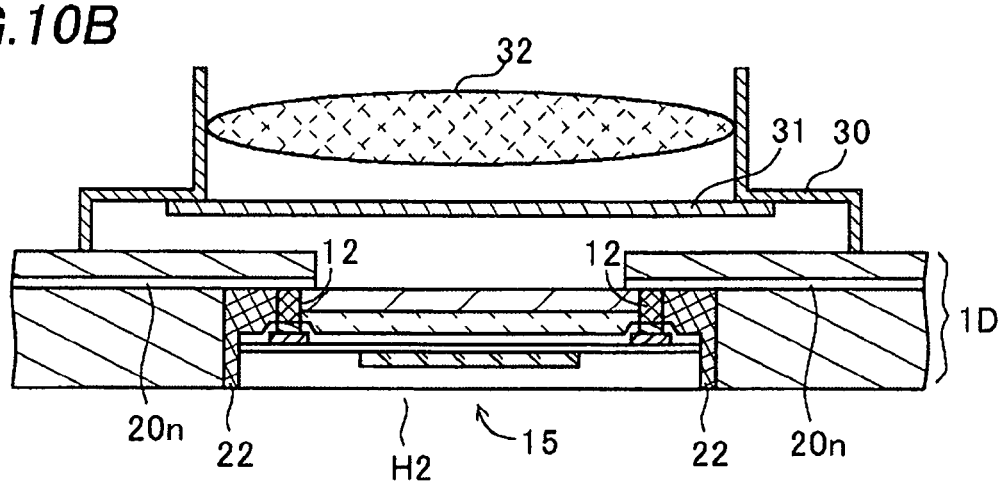

Alternatively, the semiconductor device of this embodiment may be mounted on the circuit board in a manner shown in FIGS. 10A and 10B. FIG. 10A is a plan view of the upper side of a camera module mounted with the semiconductor device of this embodiment, and FIG. 10B is a cross-sectional view of FIG. 10A along line Q-Q. The same numerals are given to the same components as those described above and description thereof will be omitted.

As shown in FIG. 10B, a concave portion H2 is formed on a back surface side of a circuit board 1D such as a printed board, and the semiconductor die 15 is disposed, being embedded in the concave portion H2. The concave portion H2 is formed by etching with laser irradiation or cutting with a drill, for example.

A Cu layer 20n is formed as a wiring layer for an external electrode in the circuit board 1D, for example, and electrically connected to the conductive terminal 12 that is an external connection electrode. The light receiving window 1W is provided in the circuit board 1D in a region corresponding to the light receiving region 16. Therefore, the semiconductor die 15 receives light even when it is mounted on the back surface of the circuit board 1D.

Since the semiconductor die 15 is mounted on the back surface of the circuit board 1D in this structure, the thickness of the circuit board 1D forms a part of the focal length. Therefore, compared with the structure where the semiconductor die 15 is disposed above the circuit board as shown in FIGS. 8A and 8B, the reduction of the height of the lens barrel 30 is achieved, so that the size of the camera module is reduced.

When there is a space between a sidewall of the concave portion H2 and the semiconductor die 15 when the semiconductor die 15 is mounted, the space is filled with the underfill 22.

Next, a semiconductor device and a method of manufacturing the semiconductor device of a third embodiment of the invention will be described referring to figures. Hereafter, the method of manufacturing the semiconductor device will be described. FIGS. 11A to 13 are cross-sectional views shown in manufacturing order. The same numerals are given to the same components as those described above and description thereof will be omitted.

Figure 11A:
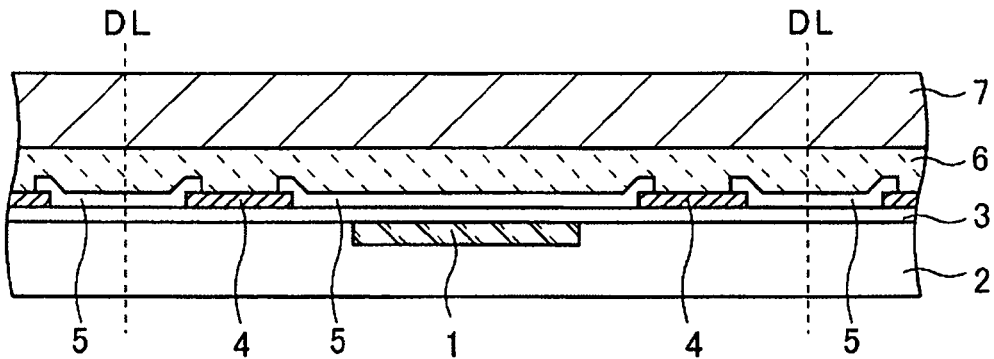
FIGS. 11A to 13 are cross-sectional views for explaining a semiconductor device and its manufacturing method of a third embodiment of the invention.

First, the semiconductor substrate 2 made of silicon (Si) or the like that is formed with the electronic device 1 on its front surface is prepared as shown in FIG. 11A. Then, the first insulation film 3 is formed on the front surface of the semiconductor substrate 2.

Then, a metal layer made of aluminum (Al), copper (Cu), or the like is formed by a sputtering method, a plating method, or the other deposition method, and the metal layer is etched using a photoresist layer (not shown) as a mask to form the pad electrode 4 on the first insulation film 3.

Then, the passivation film 5 is formed on the front surface of the semiconductor substrate 2, covering a portion of the pad electrode 4. Then, the supporting body 7 is attached on the front surface of the semiconductor substrate 2 including on the pad electrode 4 with the resin layer 6 made of epoxy resin or the like interposed therebetween. Then, according to needs, back-grinding is performed to the back surface of the semiconductor substrate 2 to thin the semiconductor substrate 2.

Figure 11B:
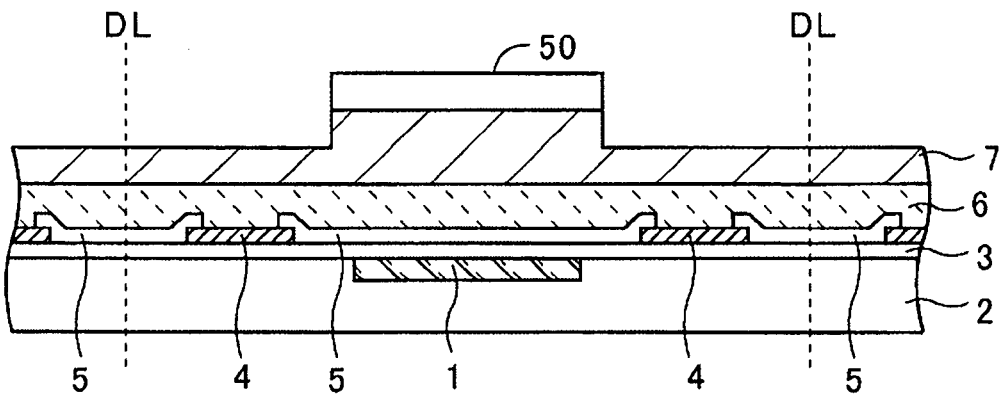

Next, as shown in FIG. 11B, a photoresist layer 50 is selectively formed on the front surface of the supporting body 7. The photoresist layer 50 is formed at least in a region overlapping the electronic device 1, or more preferably only in a region overlapping the electronic device 1. Then, the supporting body 7 is selectively etched using the photoresist layer 50 as a mask. By this etching, the supporting body 7 in a predetermined region (a portion thereof in a region not overlapping the electronic device) is etched and thinned by a predetermined amount. For example, the supporting body 7 having a thickness about 100 μm is thinned to about 30 μm in this region.

Figure 11C:
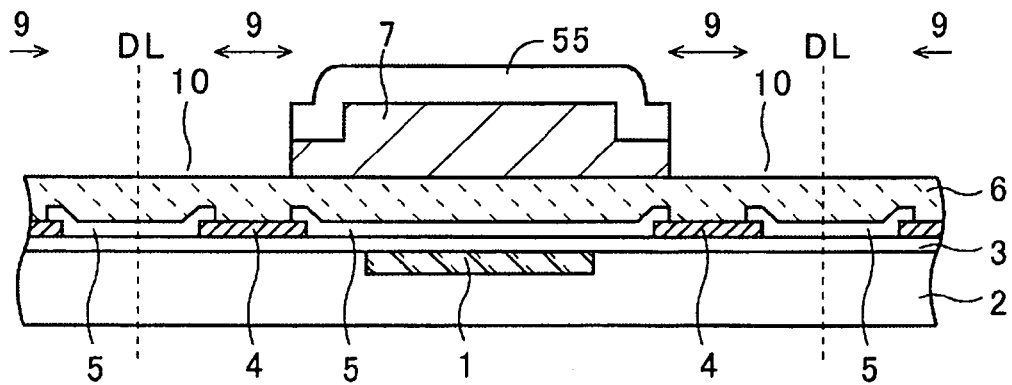

Next, as shown in FIG. 11C, a photoresist layer 55 is selectively formed on the front surface of the supporting body 7. Then, the supporting body 7 is selectively etched using the photoresist layer 55 as a mask. By this etching, the supporting body 7 in two conductive terminal formation regions 9 facing over the dicing line DL and the supporting body 7 in a region connecting with these regions 9 therebetween are removed at the same time, thereby forming the opening 10 penetrating the supporting body 7. The supporting body 7 is formed to have a convex shape, and the supporting body 7 in the region overlapping the electronic device 1 is thicker than in the other region.

Figure 12A:
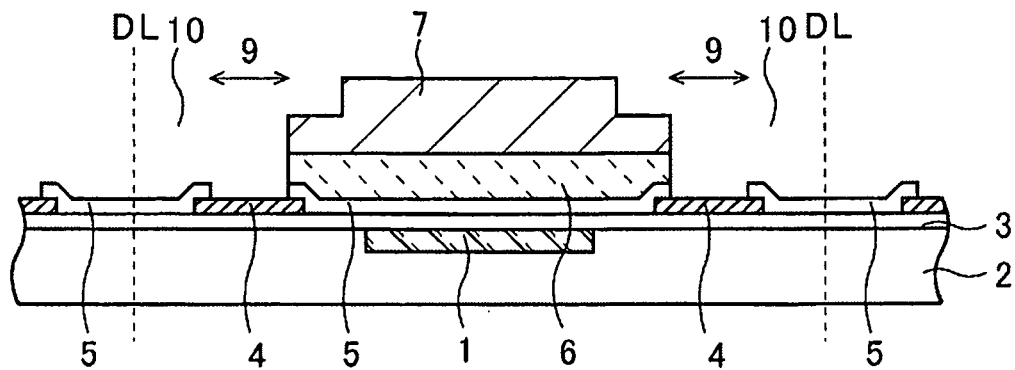
Figure 12B:
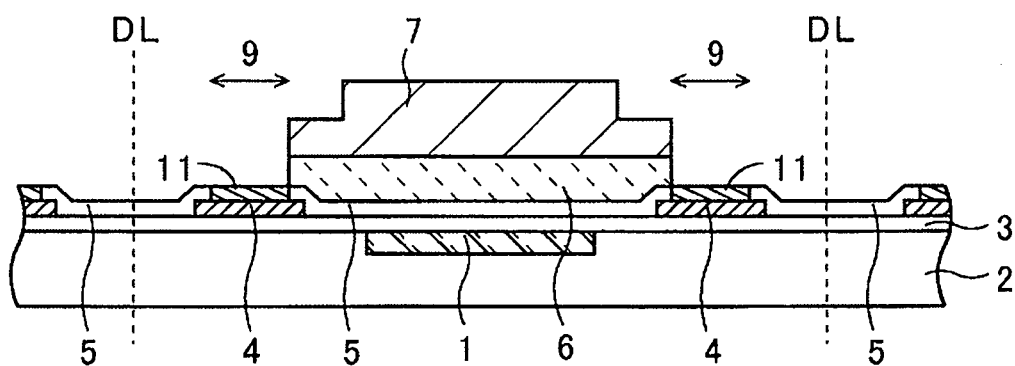

Next, as shown in FIG. 12A, the resin layer 6 exposed at the bottom of the opening 10 is selectively etched to expose a portion of the pad electrode 4. Then, as shown in FIG. 12B, the metal layer 11 made of nickel (Ni) and gold (Au) or the like is formed on the pad electrode 4 exposed at the bottom of the opening 10.

Figure 12C:
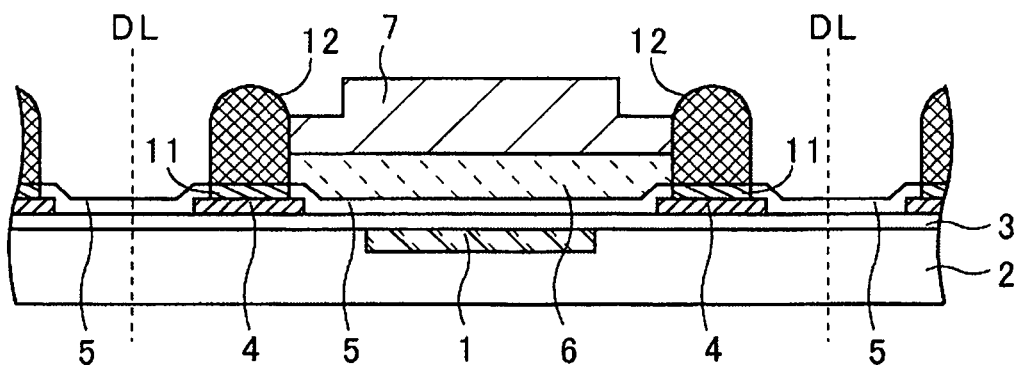
Figure 13:
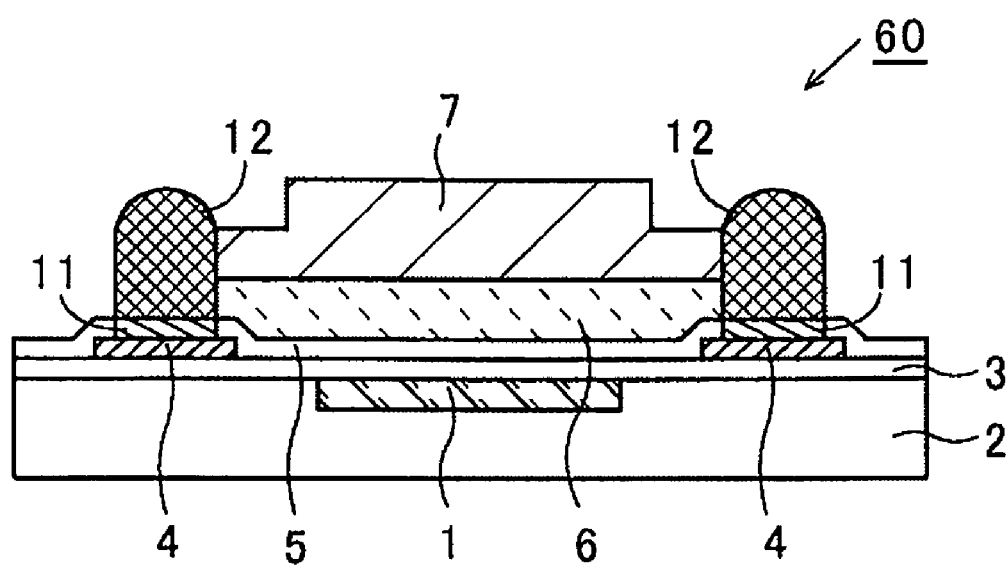

Next, as shown in FIG. 12C, the conductive terminal 12 is formed in a predetermined region of the metal layer 11. Although not shown in the figures, there is also a case of not forming the conductive terminal 12 like in the second embodiment. Lastly, as shown in FIG. 13, the semiconductor substrate 2 is separated in individual semiconductor dies 60 along the dicing line DL. The semiconductor device of the third embodiment is thus completed.

The third embodiment also has an advantage that a complex wiring such as conventionally needed is not necessary and the manufacturing process is simplified. Furthermore, the front surface of the semiconductor substrate 2 is protected by the supporting body 7 and the electronic device 1 or the surrounding elements formed on the front surface are prevented from deteriorating, thereby enhancing the reliability of the semiconductor device. Furthermore, since the opening 10 is easily formed in the supporting body 7 in the similar manner to the second embodiment, the manufacturing cost is reduced and the reliability and yield of the semiconductor device are enhanced.

Figure 14A:
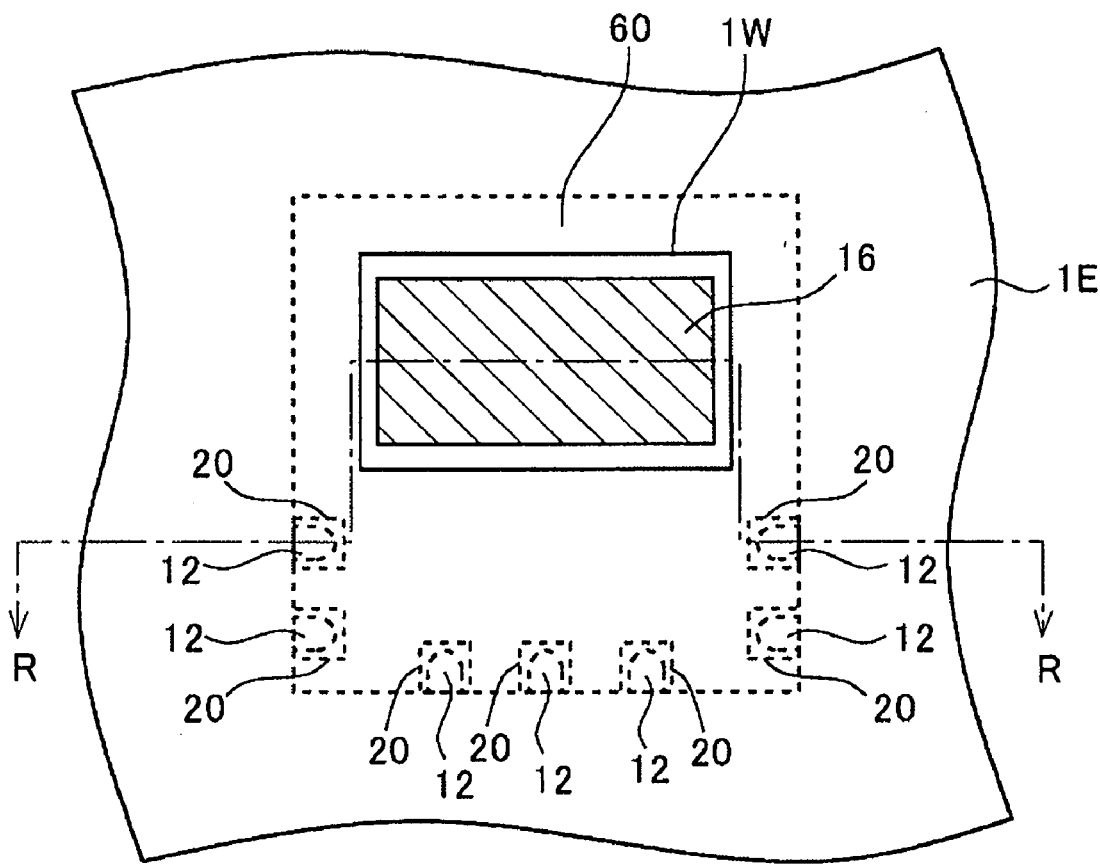
FIGS. 14A and 14B are respectively a plan view and a cross-sectional view for explaining a state where the semiconductor device of the third embodiment of the invention is mounted.
Figure 14B:
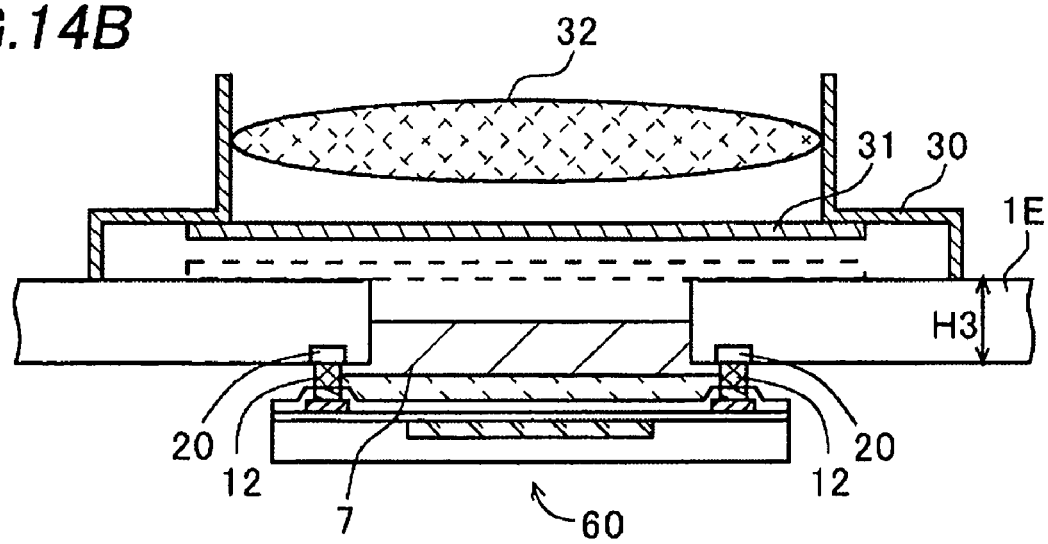

Next, descriptions will be given on a case where the semiconductor device of the third embodiment is mounted on the circuit board referring to figures. In the following description, the electronic device 1 is a light receiving element such as a CCD image sensor, a CMOS image sensor, or the like. FIG. 14A is a plan view of the upper side of a camera module mounted with the semiconductor device of the third embodiment, and FIG. 14B is a cross-sectional view of FIG. 14A along line R-R.

As shown in FIG. 14A, the semiconductor die 60 is so mounted that its front surface faces a back surface of a circuit board 1E such as, for example, a printed board. The conductive terminals 12 are directly connected with the external electrodes 20 formed on the back surface of the circuit board 1E by patterning.

Furthermore, an opening is formed in the circuit board 1E in a region overlapping the light receiving region 16 to provide the light receiving window 1W. Therefore, the semiconductor die 60 receives light even when it is mounted on the back surface of the circuit board 1E. In this embodiment, the thicker portion of the supporting body 7 (the convex portion) is fitted in the light receiving window 1W of the circuit board 1E with an adhesive (not shown). Therefore, only the front surface of the thicker portion of the supporting body 7 is exposed from the light receiving window 1W.

This structure of the semiconductor die where the supporting body 7 in a predetermined region is formed thicker facilitates cleaning of the front surface of the supporting body 7 in the light receiving region 16 after the die is mounted on the camera module, in addition to the effect of the semiconductor device of the second embodiment. The workability of the cleaning is further enhanced by making the height positions of the front surfaces of the supporting body 7 and the circuit board 1E almost the same. This further prevents the adhesive used for mounting the semiconductor die from reaching the front surface of the supporting body 7 in the light receiving region 16. Therefore, this structure has an advantage that the maintainability and reliability of the camera module are enhanced. As an example of the cleaning method, in detail, after the lens barrel 30 is dismounted, the front surface of the supporting body 7 is cleaned with a predetermined cleaning tool such as a swab.

In this structure, since the semiconductor die 60 is mounted on the back surface of the circuit board 1E, the thickness of the circuit board 1E forms a part of the focal length. Therefore, compared with the structure where the semiconductor die 15 is disposed above the circuit board as shown in FIGS. 6A and 6B, the reduction of the height of the lens barrel 30 is achieved at least by an amount of a thickness H3 of the circuit board 1E, so that the size of the camera module is reduced. The third embodiment is the same as the second embodiment in that dusts and foreign substances are effectively prevented from being attached to the light receiving surface (the front surface of the supporting body 7) and the reliability of the camera module is enhanced by disposing the filter 31 in a manner shown by a dotted line in FIG. 14B and using the filter 31 as a lid sealing the front surface of the semiconductor die 60. The third embodiment is also the same as the second embodiment in that the semiconductor die 60 is mounted on the circuit board in the various manners.

In the embodiments, since the front surface of the semiconductor substrate is protected by the supporting body, the electronic devices or the surrounding elements on the front surface are prevented from deteriorating, thereby enhancing the reliability and yield of the semiconductor device.

Furthermore, since the formation of the opening in the supporting body is easy, the manufacturing cost is minimized and the reliability and yield of the semiconductor device are enhanced. Furthermore, the size of the camera module of the invention is reduced and its reliability is enhanced.

What is claimed is:

1. A semiconductor device comprising:

a semiconductor substrate comprising an electronic device and an external connection electrode electrically connected with the electronic device; and a supporting body attached to the semiconductor substrate to cover the electronic device, the supporting body having a dent portion denting into a lateral edge of the supporting body in plan view of the semiconductor device and the external connection electrode being disposed in the dent portion,
wherein the semiconductor substrate protrudes outward in a direction of the denting of the lateral edge from a side surface of the external connection electrode that is opposite from a side surface of the external connection electrode facing the supporting body.

2. The semiconductor device of claim 1, wherein the supporting body above the electronic device is thicker than the supporting body outside the electronic device.

3. The semiconductor device of claim 1, wherein the electronic device comprises a light receiving element.

4. The semiconductor device of claim 1, further comprising a resin layer
attaching the supporting body to the semiconductor substrate.

* * * * *